United States Patent
Nasser-Faili et al.

(10) Patent No.: US 10,699,896 B2
(45) Date of Patent: Jun. 30, 2020

(54) METHODS FOR FABRICATING SEMICONDUCTOR DEVICES THAT HAVE POLYCRYSTALLINE CVD DIAMOND

(71) Applicant: RFHIC Corporation, Anyang (KR)

(72) Inventors: Firooz Nasser-Faili, Los Gatos, CA (US); Daniel Francis, Oakland, CA (US); Frank Yantis Lowe, Phoenix, AZ (US); Daniel James Twitchen, High Wycombe (GB)

(73) Assignee: RFHIC CORPORATION, Anyang (KR)

( * ) Notice: Subject to any disclaimer, the term of this patent is extended or adjusted under 35 U.S.C. 154(b) by 0 days.

(21) Appl. No.: 16/383,609

(22) Filed: Apr. 14, 2019

(65) Prior Publication Data

US 2019/0252183 A1    Aug. 15, 2019

Related U.S. Application Data

(62) Division of application No. 15/531,462, filed as application No. PCT/EP2015/079054 on Dec. 9, 2015, now Pat. No. 10,319,580.

(Continued)

(30) Foreign Application Priority Data

Feb. 23, 2015    (GB) .................................. 1502954.9

(51) Int. Cl.
*H01L 21/02*    (2006.01)
*C23C 16/27*    (2006.01)
(Continued)

(52) U.S. Cl.
CPC ...... *H01L 21/02115* (2013.01); *C23C 16/274* (2013.01); *H01L 21/0237* (2013.01);
(Continued)

(58) Field of Classification Search
CPC . H01L 51/56; H01L 51/0072; H01L 27/3244; H01L 51/5253; H01L 43/12
(Continued)

(56) References Cited

U.S. PATENT DOCUMENTS 6,506,451 B1    1/2003  Stubhan et al.
7,595,507 B2    9/2009  Francis et al.
(Continued)

FOREIGN PATENT DOCUMENTS

JP    2003-147527 A    5/2003
JP    2007-537127 A    12/2007
(Continued)

OTHER PUBLICATIONS

Cho, J et al; IEEE Transactions on Components, Packaging and Manufactring Technology; 2013; vol. 3; No. 1; pp. 79-85. Improved Thermal Interfaces of GaN-Diamond Composite Substrates for HEMT Applications.

(Continued)

*Primary Examiner* — Andy Huynh
(74) *Attorney, Agent, or Firm* — Patent Office of Dr. Chung Park

(57) ABSTRACT

A method of fabricating a semiconductor device structure includes: providing a substrate comprising a layer of compound semiconductor material; forming a seed layer of nano-crystalline diamond having a layer thickness in a range 5 to 50 nm on the layer of compound semiconductor material; and growing a layer of polycrystalline CVD diamond on the seed layer using a chemical vapour deposition (CVD) technique. An effective thermal boundary resistance ($TBR_{eff}$) at an interface between the layer of compound semiconductor material and the layer of polycrystalline CVD diamond material is no more than 50 m²K/GW.

20 Claims, 3 Drawing Sheets

Related U.S. Application Data

(60) Provisional application No. 62/093,717, filed on Dec. 18, 2014.

(51) Int. Cl.
*H01L 29/16* (2006.01)
*H01L 29/20* (2006.01)
*H01L 29/267* (2006.01)

(52) U.S. Cl.
CPC .... *H01L 21/0262* (2013.01); *H01L 21/02263* (2013.01); *H01L 21/02274* (2013.01); *H01L 21/02304* (2013.01); *H01L 21/02389* (2013.01); *H01L 21/02444* (2013.01); *H01L 21/02513* (2013.01); *H01L 21/02527* (2013.01); *H01L 21/02595* (2013.01); *H01L 29/1602* (2013.01); *H01L 29/2003* (2013.01); *H01L 29/267* (2013.01)

(58) Field of Classification Search
USPC .......................................................... 257/77
See application file for complete search history.

(56) References Cited

U.S. PATENT DOCUMENTS

| | | | |
|---|---|---|---|
| 2008/0096309 A1 | 3/2008 | Sung | |
| 2008/0296586 A1 | 12/2008 | Francis et al. | |
| 2009/0146186 A1* | 6/2009 | Kub | H01L 29/66462 257/194 |
| 2010/0068503 A1* | 3/2010 | Neogi | A44C 27/00 428/323 |
| 2014/0110722 A1 | 4/2014 | Kub et al. | |
| 2014/0339684 A1 | 11/2014 | Mollart | |
| 2016/0161991 A1* | 6/2016 | Ciraldo | C23C 16/274 428/336 |

FOREIGN PATENT DOCUMENTS

| | | |
|---|---|---|
| JP | 2013-18692 A | 1/2013 |
| JP | 2013-018692 A | 1/2013 |
| WO | 2010/010176 A1 | 1/2010 |

OTHER PUBLICATIONS

2014 IEEE Compound Semiconductor Integrated Circuit Symposium (CSICS); pp. 1-4. Thermal Interface Resistance Measurements for GaN-on-Diamond Composite Substrates.
D.C. Dumka et al., IEEE Electron Lett. 49(20), 1298 (2013).
D. Francis et al., Diamond Rel. Mater. 19(2-3), 229 (2010).
J. W. Pomeroy et al., Appl. Phys. Lett. 104(8), 083513 (2014).
J. W. Pomeroy et al., IEEE Electron Device Lett. 35(10), 1007 (2014).
N. A. Sanford et al., J. Appl. Phys. 94(5), 2980 (2003).
N. Watanabe, et al., J. Appl. Phys. 104(10), 106101 (2008).
"Low temperature boron doped diamone" Applied Physics Letters vol. 102 No. 22 Jun. 5, 2013.
J. W. Pomeroy et. al., "Low thermal resistance GaN-on-diamond transistors characterized by threedimensional Raman thermography mapping", Applied Physics Letter. 104, 083513, Feb. 26, 2014, pp. 1-5.

* cited by examiner

METHODS FOR FABRICATING SEMICONDUCTOR DEVICES THAT HAVE POLYCRYSTALLINE CVD DIAMOND

CROSS REFERENCE TO PRIOR APPLICATIONS

This application is a divisional application of a U.S. patent application Ser. No. 15/531,462, filed on May 29, 2017, which is a national Stage patent application of PCT International Patent Application No. PCT/EP2015/079054, filed on Dec. 9, 2015 under 35 U.S.C. § 371, which claims priority of U.S. 62/093,717, filed on Dec. 18, 2014 and GB 1502954.9, filed on Feb. 23, 2015, which are all hereby incorporated by reference in their entirety.

FIELD OF THE INVENTION

Certain embodiments of the present invention relate to compound semiconductor device structures, and methods of fabrication, comprising polycrystalline CVD diamond with low thermal boundary resistance between the compound semiconductor and the polycrystalline CVD diamond. The primary application of this invention is thermal management of high-power electronic and optoelectronic devices.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic device while maximizing performance (power and speed) and reliability. Examples of such devices are microwave transistors, light-emitting diodes and semiconductor lasers. Depending on the frequency of operation and power requirements, these devices have been conventionally made on silicon, gallium arsenide (GaAs), indium phosphide (InP), and in recent years gallium nitride (GaN), aluminum nitride (AlN) and other wide-gap semiconductors. Gallium nitride material systems in particular give rise to microwave transistors with high-electron mobility (necessary for high-speed operation), high breakdown voltage (necessary for high power), and thermal conductivity that is greater than GaAs, InP, or silicon, and thus advantageous for use in high power applications. GaN is also used in manufacturing of blue and ultraviolet lasers and light-emitting diodes. In spite of the high-temperature performance, GaN electronic and optoelectronic devices are limited in performance due to relatively low thermal resistance of the substrates commonly used for growth of GaN. This deficiency is most pronounced in high-power microwave and millimeter-wave transistors and amplifiers where reduced cooling requirements and longer device life, both benefiting from lower junction temperature, are in critical demand. Similar need is exhibited in high-power blue and ultraviolet lasers where a several-micrometer-wide laser cavity stripe dissipates power into the chip though low thermal conductivity materials.

It is well known that when considering isotropic behaviors diamond is the most thermally conductive substance known to man at room temperature. For this reason, the semiconductor industry has been employing diamond heat-sinks and heat spreaders for improved thermal management since the commercialization of synthetic diamond by chemical-vapor deposition in the 1980s. The objective of optimal heat management is to bring the diamond heat-spreader or diamond layers into close proximity to the heat source in the electronic or optoelectronic devices. This means building devices on thin chips and mounted on diamond heat-spreaders, coating devices with diamond layers, or transferring device epilayers (epitaxially grown semiconductor layers) onto diamond.

GaN-on-diamond technology and resulting devices (described in U.S. Pat. No. 7,595,507) involve structures which feature GaN epilayers less than a micron from a CVD diamond substrate. This technology enables bringing together the best heat conductor (diamond) together with electronic and optoelectronic devices based on gallium-nitride (GaN) and GaN-related compounds while minimizing any thermal barrier associated with, for example, more common semiconductor-solder-diamond attachment schemes. Due to GaN's inherent high critical electrical field and wide bandgap, GaN devices are preferred for high power electrical and optoelectronic applications, such as, high power RF transistors and amplifiers, power management devices (Schottky diodes and switching transistors), as well as, high power blue and ultraviolet lasers or light-emitting diodes.

GaN is presently grown on several different substrates: sapphire, silicon, silicon carbide, aluminum nitride, single-crystal diamond, and GaN substrates. With the exception of GaN substrates, all other materials have lattice constants that differ from that of GaN and AlGaN. Natural diamond is an excellent thermal conductor, but has not been available for these applications due to its available area, reduced thermal properties over high purity synthetic diamond, and cost. Presently, synthetic diamond is being manufactured with various degrees of crystallinity. Polycrystalline diamond deposited by chemical-vapor deposition (CVD) is suitable for use in the semiconductor industry as its thermal conductivity is close to that of single crystal diamond, it can provide electrical isolation, has low dielectric losses, and can be made transparent. CVD diamond substrates for semiconductor industry can be formed as round wafers with standard diameters. Diamond wafers are manufactured by chemical vapor deposition by one of three main methods: plasma enhanced diamond CVD where the energy to dissociate the reactants comes from a microwave source, thermally assisted diamond CVD where the energy for dissociating gasses comes from a hot filament, and plasma torch where ions are accelerated using a high DC voltage. In these processes, synthetic diamond is grown on top of non-diamond substrates, such as, silicon, silicon nitride, silicon carbide and different metals.

The CVD diamond growth process is carried out in a vacuum chamber within which a substrate is provided on top of which diamond is to be grown. The substrate is exposed to the energy source needed to dissociate molecules of precursor gases needed to form diamond on the surface of the substrate. The precursor gases needed in the chemical vapor deposition of diamond are a source of carbon diluted in hydrogen ($H_2$). Typical carbon-carrying gases are methane ($CH_4$), ethane ($C_2H_6$), carbon monoxide (CO), and acetylene ($C_2H_2$), with methane ($CH_4$) being the most commonly used. The gas combination needed for efficient diamond deposition contains a small (several percent) composition of the carbon-carrying gas in hydrogen, and the reaction can be further assisted with addition of oxygen or oxygen precursors such as CO or $CO_2$. A most common parameter specifying the gas-flow recipe is given in terms of the molar ratio of carbon carrying gas flow and hydrogen gas flow. For example, in terms of percentage $[CH_4]/[H_2]$ where

[CH$_4$] and [H$_2$] are molar flow rates typically measured in standard cubic centimeters per minute (sccm). Typical substrate temperatures during the deposition process are between 550° C. and 1200° C., and deposition rates are usually measured in micrometers (μm) per hour.

Growth of synthetic diamond on non-diamond substrates includes a surface preparation phase and a nucleation phase in which conditions are adjusted to enhance the growth of diamond crystals on the host (non-diamond) substrate. This is most commonly done by seeding (linked also to substrate scratching) the surface with diamond powder in a controlled and repeatable manner. During the growth phase, the grain size of synthetic diamond increases and as a result synthetic diamond films are inherently rough after deposition. The nucleation of diamond generally starts with very small diamond domains embedded in non-diamond matrix which has poor thermal conductivity in the near-substrate regions. Various types of seeding have been discussed in the prior art including mechanical, ultrasonic and mega-sonic seeding of nucleation layers on various substrates and wafers.

The increasing high power density in GaN-based HEMTs (high electron mobility transistors) makes thermal management critically important. CVD polycrystalline diamond of high thermal conductivity offers superior heat removal capability near the device junction compared to state-of-the-art SiC substrates. The latest GaN-on-diamond HEMTs have demonstrated excellent device characteristics [D. C. Dumka et al., IEEE Electron Lett. 49(20), 1298 (2013)] and are scalable to 4-inch wafers [D. Francis et al., Diamond Rel. Mater. 19(2-3), 229 (2010)]. This GaN-on-diamond technology starts with a MOCVD-grown AlGaN/GaN epilayer on silicon or silicon carbide, and involves depositions of a thin dielectric seeding layer (e.g. amorphous silicon carbide, silicon, silicon nitride, aluminium nitride, magnesium oxide, boron nitride, or beryllium oxide) and CVD diamond on the exposed GaN, following the removal of the native GaN growth substrate and transition layers [D. C. Dumka et al., IEEE Electron Lett. 49(20), 1298 (2013); D. Francis et al., Diamond Rel. Mater. 19(2-3), 229 (2010)]. The dielectric seeding layer serves as both a nucleation layer for the diamond material and a protective layer for the GaN during diamond growth. As such, the dielectric seeding layer must be sufficiently thick to fulfill these functions. However, the dielectric interlayer and the initial nucleation layer of diamond growth result in an effective thermal boundary resistance (TBR$_{eff}$) at the GaN/diamond interface, which is a major thermal barrier that limits the full thermal benefit of diamond [J. W. Pomeroy et al., Appl. Phys. Lett. 104(8), 083513 (2014)].

To date, direct growth of diamond on GaN has been problematic. This has primarily been due to reaction of atomic hydrogen with exposed GaN and the subsequent degradation and reduction of the GaN substrate. The typical method for circumventing the problem known to practitioners in the art has been to grow a dielectric interlayer on top of the GaN which serves as both a protective layer for GaN and a nucleation layer for diamond as described above. While this approach has been successful in protecting the GaN layer, it has introduced multiple thermal boundaries that negatively impact the total thermal resistance and full benefits of a highly conductive substrate. In addition, the requirement for a dielectric interlayer between the GaN and the diamond introduces additional surface preparation and deposition steps into the fabrication process which increase the complexity and expense of the fabrication process.

A significant challenge in achieving intimate integration of diamond with GaN, lies in balancing the reduction of thermal boundary resistance (TBR) due to various layers at the interface of GaN and diamond, achieving the right level of seeding for robust adhesion to the nucleating layer(s), and providing sufficient protection for the underlying GaN when depositing CVD diamond thereon so as to not adversely affect the electronic properties of the GaN epilayer structure. The present inventors have studied the effect of the dielectric interlayer thickness on the effective thermal boundary resistance (TBR$_{eff}$) at the GaN/diamond interface. The present inventors have previously found that a dielectric interlayer of at least about 35 nm thickness is required to protect a GaN substrate during CVD diamond growth thereon. However, this results in a lower limit to the effective thermal boundary resistance between the GaN and diamond.

SUMMARY OF THE INVENTION

The present inventors have developed a diamond seeding technique which allows one to completely eliminate the dielectric seeding layer while still allowing diamond growth on a compound semiconductor substrate without damaging the compound semiconductor material. The method uses ultra-nano-crystalline diamond sonication to form a substantially void free nano-crystalline diamond nucleation layer of a controlled thickness. This results in a semiconductor device structure comprising:

a layer of compound semiconductor material; and
a layer of polycrystalline CVD diamond material, wherein the layer of polycrystalline CVD diamond material is bonded to the layer of compound semiconductor material via a layer of nano-crystalline diamond which is directly bonded to the layer of compound semiconductor material, the layer of nano-crystalline diamond having a thickness in a range 5 to 50 nm and configured such that an effective thermal boundary resistance (TBR$_{eff}$) as measured by transient thermoreflectance at an interface between the layer of compound semiconductor material and the layer of polycrystalline CVD diamond material is no more than 50 m$^2$K/GW.

Embodiments of the present invention provide a direct diamond-to-compound semiconductor (e.g. GaN) interface without any dielectric interlayer disposed therebetween and without damaging the compound semiconductor. As such, both thermal and electronic properties of the device structure can be optimized. Furthermore, by eliminating the requirement for a dielectric interlayer between the diamond and compound semiconductor layers, the fabrication process can be simplified with few surface preparation and deposition steps.

The method of fabricating a semiconductor device structure as defined above comprises:

providing a substrate comprising a layer of compound semiconductor material;

forming a seed layer of nano-crystalline diamond having a layer thickness in a range 5 to 50 nm on the layer of compound semiconductor material; and growing a layer of polycrystalline CVD diamond on said seed layer using a chemical vapour deposition (CVD) technique.

It has been found that a suitable seed layer can be formed using a colloidal suspension of nanocrystalline diamond powder and application of sonic power, with particle size, deposition time, and sonic power selected to achieve the required effective thermal boundary resistance (TBR$_{eff}$) while also ensuring that the seed layer functions as an effective protective barrier during CVD diamond growth such that the underlying compound semiconductor is not unduly damaged. Further still, it has been surprisingly found that such a seed layer does not prevent adhesion of the CVD diamond layer to the compound semiconductor substrate. This is very surprising as one would have thought that the provision of a relatively thick layer of nano-crystalline seed particles over the substrate would prevent adhesion of the CVD diamond layer to the compound semiconductor substrate. That is, one would have thought that the CVD diamond layer would bond to the layer of nano-crystalline seed particles but the nano-crystalline seed particles would not become bonded to the underlying compound semiconductor substrate. While not being bound by theory, it would appear that if the compound semiconductor layer is made sufficiently flat and smooth, and nanometer size diamond seed particles are utilized, then the nanometer size diamond seed particles bond electrostatically to the compound semiconductor layer. A surprisingly thick layer of nanometer size diamond particles can be formed in this manner. This compares with larger micrometer size diamond seed particles which do not electrostatically bond in this manner. Furthermore, again while not being bound by theory, it would appear that vapour phase infiltration of the nano-crystalline diamond seed layer may occur during the early stages of diamond growth resulting in the nano-crystalline seed particles bonding to the underlying compound semiconductor substrate and also to each other to form a coherent bonded nano-crystalline diamond layer without substantially damaging the underlying compound semiconductor substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF THE INVENTION

Before describing a modified seeding technique for achieving low thermal boundary resistance GaN-on-Diamond products in accordance with embodiments of the present invention, a description of a new measurement technique for probing the thermal boundary resistance of such products is given below.

The measurement technique comprises a transient thermoreflectance method to characterize the GaN-on-diamond $TBR_{eff}$. This fully contactless technique does not require any additional deposition and can be used on as-grown wafers prior to device fabrication. The rapid evaluation of wafer thermal resistance enables GaN-on-diamond wafer manufacturers to refine the growth conditions for improving the transistor thermal performance.

Figure 1:
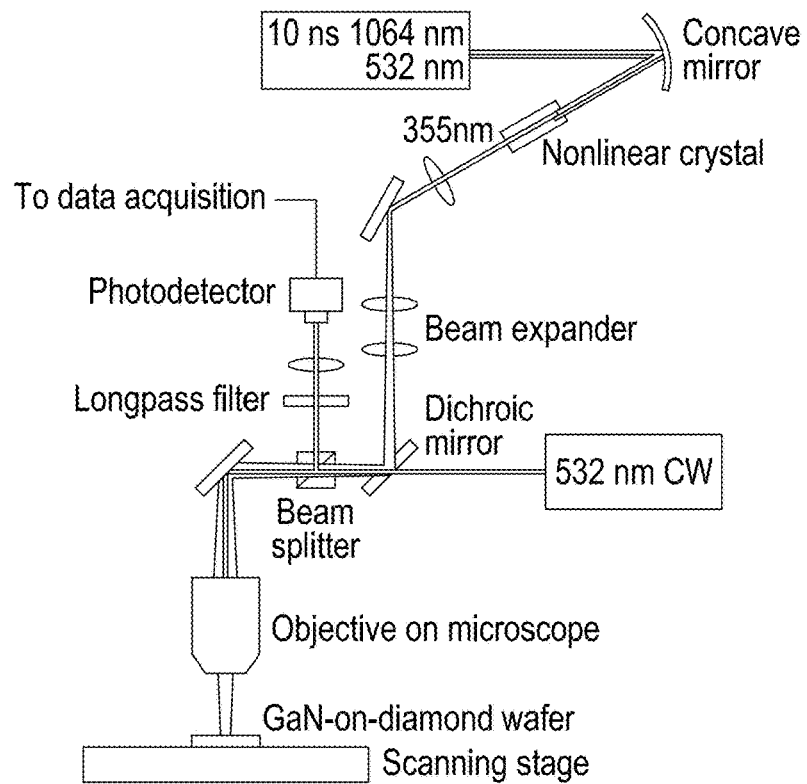
FIG. 1 shows a schematic of a transient thermoreflectance measurement setup used to measure an effective thermal boundary resistance ($TBR_{eff}$) at an interface between a layer of compound semiconductor material and a layer of polycrystalline CVD diamond material.

The nanosecond transient thermoreflectance method is a laser-based pump-probe technique [J. W. Pomeroy et al., IEEE Electron Device Lett. 35(10), 1007 (2014)]. A 10 ns, 355 nm pulse laser (third harmonic of Nd:YAG) above the GaN bandgap is used as a pump beam to impulsively heat the AlGaN/GaN surface. This temperature rise induces a change in the surface reflectance which is linearly temperature dependent. A 532 nm CW laser (second harmonic of Nd:YAG) is used as a probe beam to monitor this reflectance (and thus temperature) change in the time domain. The surface temperature relaxes due to heat diffusion into the GaN layer and diamond substrate, and in this way thermal properties including $TBR_{eff}$ can be extracted from the temperature transient. The two laser beams are coaxially directed to a standard microscope for convenient wafer mapping. An amplified silicon photodetector is used to record the intensity of the probe laser reflected from the sample surface. A schematic of the experimental setup is shown in FIG. 1.

Figure 2:
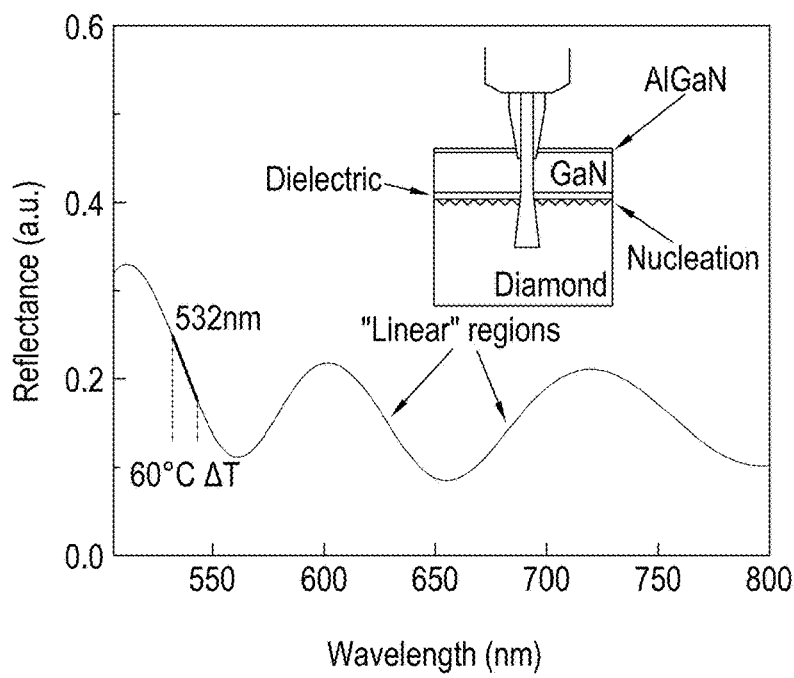
FIG. 2 shows a reflectance spectrum of a GaN-on-diamond wafer, demonstrating the validity of the linear approximation between reflectance change and surface temperature modulation at a probe laser wavelength of 532 nm.

Under certain conditions, due to partially coherent internal reflections when the probe laser wavelength is in the vicinity of the maximums or minimums of the total reflectance spectrum, the reflectance change may not be proportional to the surface temperature modulation. The probe laser wavelength (532 nm) chosen here does not fall into these "nonlinear" regions, which is illustrated in FIG. 2. A temperature rise of 60° C. is equivalent to a 10 nm shift in wavelength for the reflectance, calculated using the wavelength [N. A. Sanford et al., J. Appl. Phys. 94(5), 2980 (2003)] and temperature [N. Watanabe, et al., J. Appl. Phys. 104(10), 106101 (2008)] dependence of the GaN refractive index. In these measurements, the maximum temperature modulation is less than 60° C., within regions where a linear approximation between reflectance change and surface temperature rise is valid. Moreover, identical thermoreflectance decays were obtained on wafers with and without a gold transducer [J. W. Pomeroy et al., IEEE Electron Device Lett. 35(10), 1007 (2014)], verifying that the response indeed originates from the surface temperature.

Figure 3:
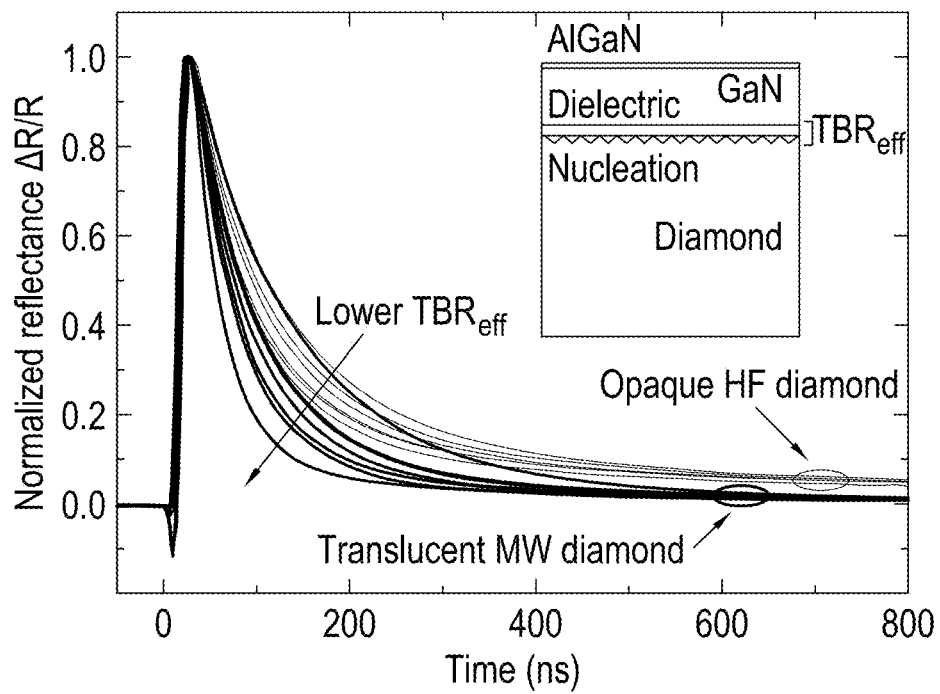
FIG. 3 shows a normalized transient reflectance of GaN-on-diamond wafers with different thicknesses of the dielectric seeding layer—two diamond growth methods were used: hot filament (HF) CVD; and microwave (MW) plasma CVD (inset shows a schematic of the sample layer structure).

FIG. 3 shows the time-resolved normalized reflectance change of a series of GaN-on-diamond wafers, each having a nominal thickness of the dielectric seeding layer from 28 nm to 100 nm, and a diamond substrate grown by either hot filament (HF) CVD or microwave (MW) plasma CVD. A faster decay in the transient (and thus the surface temperature) indicates a lower $TBR_{eff}$, as heat diffuses more efficiently into the diamond substrate. This measurement is most sensitive to $TBR_{eff}$ since the GaN/diamond interface is the dominant heat barrier. The effect of the diamond substrate, however, also contributes to the temperature transient as seen on the long timescales in FIG. 3. The separation of the transients beyond 500 ns suggests that opaque HF diamond has a smaller thermal conductivity than the translucent MW diamond.

Figure 4:
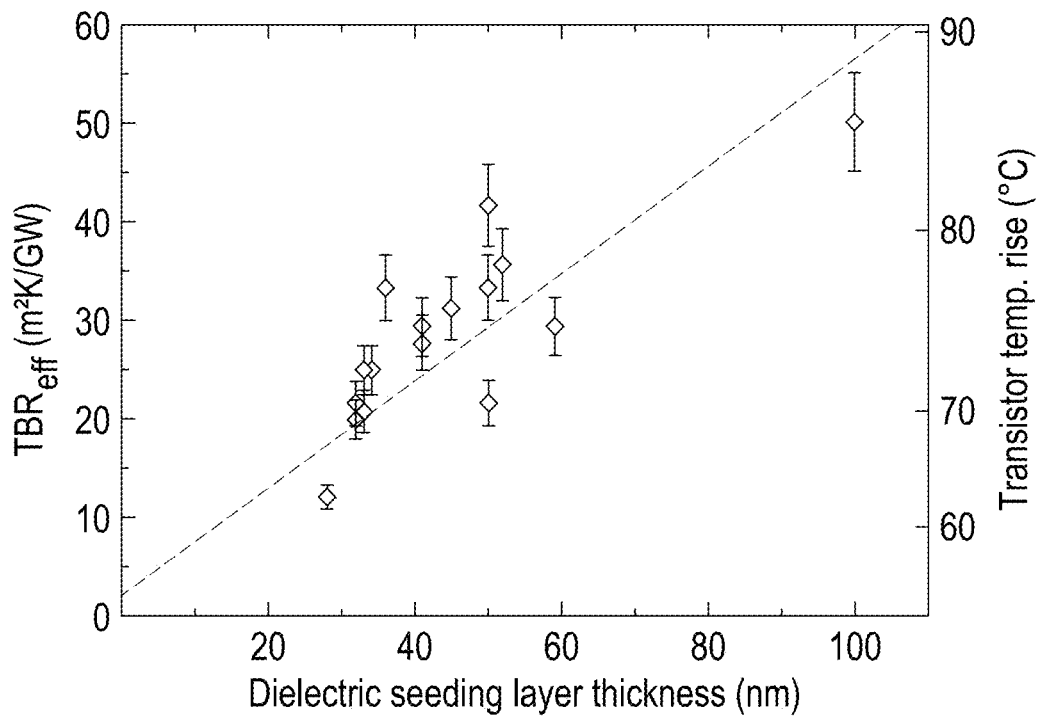
FIG. 4 shows $TBR_{eff}$ of a GaN/diamond interface as a function of dielectric seeding layer thickness—the corresponding transistor peak channel temperature rise is indicated on the right vertical axis.

The measured transients were fitted using a finite element thermal model and the extracted $TBR_{eff}$ is plotted as a function of the dielectric interlayer thickness in FIG. 4. $TBR_{eff}$ follows approximately a linear relationship with the dielectric layer thickness; the deviations are likely due to the contribution of the diamond nucleation surface that varies from wafer to wafer. Using a multi-finger transistor thermal model [J. W. Pomeroy et al., IEEE Electron Device Lett. 35(10), 1007 (2014)], the peak channel temperature rise corresponding to each $TBR_{eff}$ was calculated and shown on the right vertical axis. This highlights the importance of reducing $TBR_{eff}$ to lower the device thermal resistance. By decreasing $TBR_{eff}$ from 50 $m^2K/GW$ to 12 $m^2K/GW$, the transistor channel temperature rise can be reduced by 30%. However, it has been found that using standard diamond seeding techniques a ceramic interlayer of at least about 35 nm thickness is required to protect a GaN substrate during CVD diamond growth thereon. As can be seen from FIG. 4, this results in a lower limit to the effective thermal boundary resistance of about 20 to 25 $m^2K/GW$.

In light of the above, the present inventors have investigated different methods of providing a better interface between a compound semiconductor substrate and a polycrystalline CVD diamond layer growth thereon. In doing so, the present inventors have developed an optimized diamond seeding technique which allows one to completely eliminate the dielectric seeding layer while still allowing diamond growth on a compound semiconductor substrate without damaging the compound semiconductor. The method uses sonication and/or electrochemical deposition of nano and/or ultra-nano-crystalline diamond to form a substantially void free diamond nucleation layer of a controlled thickness. This results in a semiconductor device structure comprising:
 a layer of compound semiconductor material; and
 a layer of polycrystalline CVD diamond material,
 wherein the layer of polycrystalline CVD diamond material is bonded to the layer of compound semiconductor material via a layer of nano-crystalline diamond which is directly bonded to the layer of compound semiconductor material, the layer of nano-crystalline diamond having a thickness in a range 5 to 50 nm and configured such that an effective thermal boundary resistance ($TBR_{eff}$) as measured by transient thermoreflectance at an interface between the layer of compound semiconductor material and the layer of polycrystalline CVD diamond material is no more than 50 $m^2K/GW$, 40 $m^2K/GW$, or 30 $m^2K/GW$.

This device structure, which does not include an additional dielectric interlayer between the diamond material and the compound semiconductor material, avoids the requirement for an additional ceramic deposition step that subjects the compound semiconductor wafer to high temperatures and can impact yield and/or cost. Furthermore, by eliminating the additional dielectric interlayer this opens up the opportunity to further reduce the effective thermal boundary resistance between the diamond material and the compound semiconductor material down towards the theoretical minimum of 3 $m^2K/GW$, or at least match the best previous values above 10 $m^2K/GW$, for example, in the range 20 to 30 $m^2K/GW$, for device structures including a thin dielectric interlayer.

It has been found that a suitable seed layer can be formed using a colloidal suspension of nano-crystalline diamond powder and application of sonic power, with particle size, deposition time, and sonic power selected to achieve the required effective thermal boundary resistance ($TBR_{eff}$) while also ensuring that the seed layer functions as an effective protective barrier during CVD diamond growth such that the underlying compound semiconductor is not unduly damaged. An alternative is to use electrochemical methods where the diamond/wafer relative potentials are controlled to give uniform and conformal deposition. Further still, it has been surprisingly found that such a seed layer does not prevent adhesion of the CVD diamond layer to the compound semiconductor substrate.

Whilst techniques for seeding comprising colloidal suspensions, nanocrystalline diamond powders, and application of sonic power or electrochemical deposition have been described before for seeding and growth of high nucleation density diamond, the impact and nature of such methods for improving the thermal barrier resistance of a diamond-compound semiconductor interface has not previously been demonstrated. The present inventors have devised a methodology for coating of compound semiconductor substrates that allows tailoring of the thickness and density of the seed stack dispersed on the semiconductor substrate and consequently control of the TBR associated with formation of such stacks beyond previously achieved results. By adjusting, for example, the time, the sonic power, and the seeding media the present inventors have demonstrated control of the thickness of the stack and density of the dispersion in such a way to optimize the TBR associated with presence of such a layer between GaN and diamond. In particular, by replacing the dielectric interlayer with a relatively thick (in seeding terms) and thermally conductive ultra-nano and/or nano-crystalline diamond coating for nucleation, the present inventors have eliminated two thermal interfaces and one thermally challenged nucleation/protection layer.

The layer of polycrystalline CVD diamond material can be bonded to the layer of compound semiconductor material via a layer of nano-crystalline diamond having a layer thickness in a range 5 to 50 nm, 10 to 40 nm, or 15 to 30 nm. Auger depth profiling can be used for the establishment of an ultra-nano-crystalline seed layer (the thickness of the seed layer in one example being about 25 nm).

Figure 5:
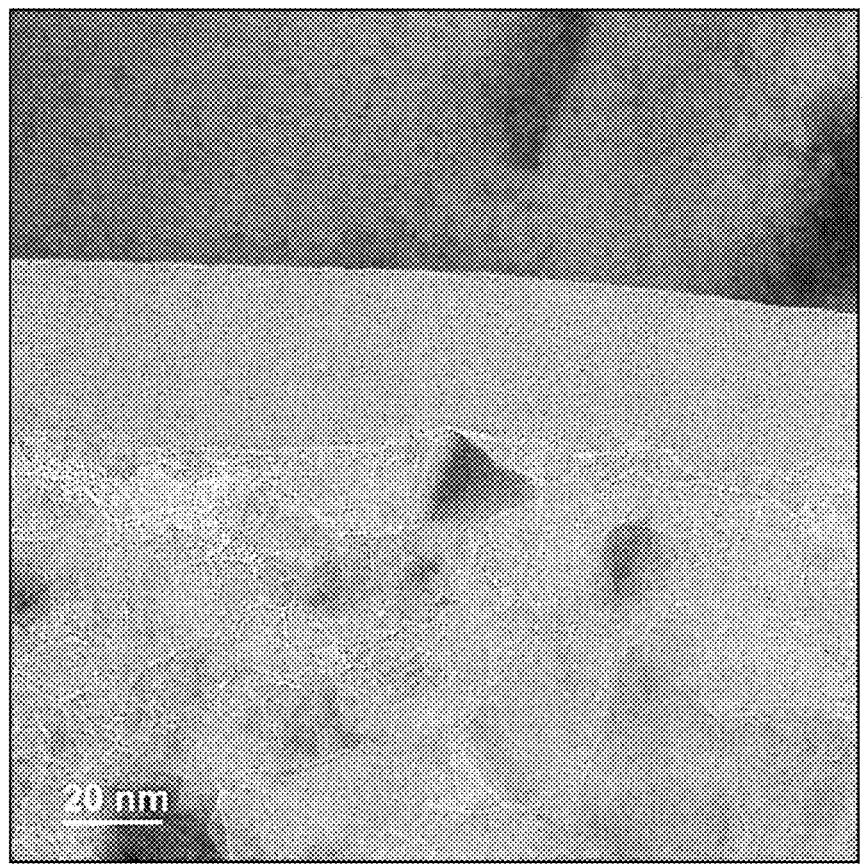
FIG. 5 shows a Transmission Electron Micrograph (TEM) cross-section of the ultra-nano-crystalline seed layer indicating a well-defined, ordered nano-crystalline diamond interface with discernible diamond seeds and free of interfacial voids.

FIG. 5 shows a Transmission Electron Micrograph (TEM) cross-section of the ultra-nano-crystalline seed layer indicating a well-defined, ordered nano-crystalline diamond interface with discernible diamond seeds and free of interfacial voids. The layer of nano-crystalline diamond may have a volume fraction of voids as measured using transmission electron microscopy imaging of no more than 10%, 8%, 6%, or 4%. Alternatively, or additionally, the layer of nano-crystalline diamond may have no voids having a thickness greater than 20 nm, 15 nm, 10 nm, or 5 nm in a representative sample comprising an area of at least 200 nm×100 nm. Preferably, the layer of nano-crystalline diamond has no visible voids discernible in transmission electron microscopy imaging in a representative sample comprising an area of at least 200 nm×100 nm.

The seed layer as described above enables polycrystalline CVD diamond material to be directed deposited on a compound semiconductor substrate without the requirement for a dielectric interlayer. While the present invention can be applied to a range of compound semiconductors, according to certain embodiments the layer of compound semiconductor material comprises a III-V compound semiconductor material, e.g. gallium nitride.

The layer of polycrystalline CVD diamond material grown on the seed layer may have a thickness of at least 5 micrometers, 10 micrometers, 20 micrometers, 30 micrometers, 50 micrometers, 80 micrometers, 100 micrometers, 200 micrometers, 300 micrometers, or 500 micrometers. While the seed layer comprises nano-crystalline diamond particles, the overlying polycrystalline CVD diamond material grown on the seed layer preferably comprises micron scale grains (i.e. the layer of polycrystalline CVD diamond material comprises grains having a size greater than 1 micron), and is preferably microwave plasma CVD diamond material, as this type of polycrystalline CVD diamond material has a higher thermal conductivity than hot filament polycrystalline CVD diamond and/or nano-polycrystalline CVD diamond.

Figure 6:
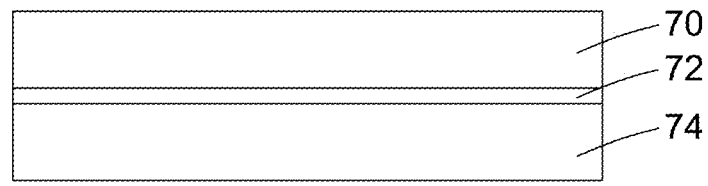
FIG. 6 shows a schematic diagram of a three layer structure comprising a layer of compound semiconductor material, a layer of nano-crystalline diamond, and a layer of micro-crystalline diamond.

FIG. 6 shows a schematic diagram of a three layer structure as described above comprising a layer of compound semiconductor material 70, a layer of nano-crystalline diamond 72, and a layer of micro-crystalline diamond 74.

The method of fabricating a semiconductor device structure as defined above comprises:
  providing a substrate comprising a layer of compound semiconductor material;
  forming a seed layer of nano-crystalline diamond having a layer thickness in a range 5 to 50 nm, 10 to 40 nm, or 15 to 30 nm on a surface of said substrate; and
  growing a layer of polycrystalline CVD diamond on said seed layer using a chemical vapour deposition (CVD) technique.

The seed layer can be formed using a nanocrystalline diamond powder having an average particle size of no more than 15 nm or 10 nm and/or no less than 1 nm. A D90 particle size of the nanocrystalline diamond powder used in the seeding step can be no more than 40 nm, 30 nm, or 20 nm. Furthermore, the seed layer can be formed using a colloidal suspension of nanocrystalline diamond powder and deposition parameters, such as deposition time and sonic power, can be controlled to achieve the required effective thermal boundary resistance ($TBR_{eff}$).

One method for preparing the compound semiconductor substrate is to bond a GaN on silicon wafer to a carrier silicon wafer and then etch off the growth silicon wafer leaving the bonded wafer intact. After the removal of the growth silicon wafer the back side of the GaN material is exposed. This exposed surface is then submerged in a tank with nano-diamond seeds in an alcohol solution and the entire tank is ultrasonically seeded for a period of 10 minutes. The adjustment of the thickness of the seed layer is made by adjusting the exact time of the seeding. This exact time depends on the density and size of particles. The compound semiconductor substrate is then removed from the tank and spun dry to remove poorly attached seeds. The resultant wafer, after the alcohol dries is ready for diamond deposition.

The nano-crystalline layer serves as both a nucleation layer and a protective layer for the compound semiconductor substrate. This results in a low TBR in combination with the retention of good GaN electronic properties, i.e. the GaN is not unduly damaged by the CVD diamond growth process due to the presence of the nano-crystalline diamond seed layer. As such, the present invention provides a synthesis route to the first successful demonstration of direct attachment of diamond to GaN without damaging the GaN. For example, the compound semiconductor epilayer structure may have one or more of the following characteristics while being directly bonded to a diamond heat spreading layer:
  a charge mobility of at least 1200 $cm^2V^{-1}$, $s^{-1}$, 1400 $cm^2V^{-1}$, $s^{-1}$ or 1600 $cm^2V^{-1}s^{-1}$;
  a sheet resistance of no more than 700/square, 600/square, or 500/square;
  a current leakage of no more than $10^{-5}$ amps, $10^{-6}$ amps, $10^{-7}$ amps; and
  a maximum power of at least 5 W/mm, 6 W/mm, or 7 W/mm.

While this invention has been particularly shown and described with reference to embodiments, it will be understood to those skilled in the art that various changes in form and detail may be made without departing from the scope of the invention as defined by the appending claims.

The invention claimed is:

1. A method of fabricating a semiconductor device structure, comprising:
  providing a substrate comprising a layer of compound semiconductor material;
  forming a seed layer of nano-crystalline diamond having a layer thickness in a range 5 to 50 nm on the layer of compound semiconductor material; and
  growing a layer of polycrystalline CVD diamond on the seed layer using a chemical vapour deposition (CVD) technique,
    wherein an effective thermal boundary resistance ($TBR_{eff}$) at an interface between the layer of compound semiconductor material and the layer of polycrystalline CVD diamond material is no more than 50 $m^2K/GW$.

2. A method as recited in claim 1, wherein the seed layer is formed using a nano-crystalline diamond powder having an average particle size of no more than 15 nm.

3. A method as recited in claim 2, wherein the seed layer is formed using a nano-crystalline diamond powder having an average particle size of no less than 1 nm.

4. A method as recited in claim 1, wherein a D90 particle size of nano-crystalline diamond powder used in the step of forming a seed layer is no more than 40 nm.

5. A method as recited in claim 1, wherein the thickness of the seed layer is in a range 10 to 40 nm.

6. A method as recited in claim 1, wherein the thickness of the seed layer is in a range 15 to 30 nm.

7. A method as recited in claim 1, wherein the seed layer has a volume fraction of voids of no more than 10%.

8. A method as recited in claim 1, wherein the seed layer has a volume fraction of voids of no more than 8%.

9. A method as recited in claim 1, wherein the seed layer has no voids having a thickness greater than 20 nm in a representative sample comprising an area of at least 200 nm×100 nm.

10. A method as recited in claim 1, wherein the layer of polycrystalline CVD diamond has a thickness of at least 5 micrometers.

11. A method as recited in claim 1, wherein the layer of polycrystalline CVD diamond comprises grains having a size greater than 1 micron.

12. A method as recited in claim 1, wherein the layer of compound semiconductor material comprises a III-V compound semiconductor material.

13. A method as recited in claim 12, wherein the III-V compound semiconductor material is gallium nitride.

14. A method as recited in claim 1, wherein the layer of compound semiconductor material has the following characteristics;
  a charge mobility of at least 1200 $cm^2V^{-1}s^{-1}$;
  a sheet resistance of no more than 700 $\Omega$/square;
  a current leakage of no more than $10^{-5}$ amps; and
  a maximum power of at least 5 W/mm.

15. A method for fabricating a semiconductor device structure, comprising:
   providing a substrate comprising a layer of compound semiconductor material;
   forming a dielectric layer on the substrate;
   forming a seed layer of nano-crystalline diamond having a layer thickness in a range 5 to 50 nm on the dielectric layer; and
   growing a layer of polycrystalline CVD diamond on the seed layer using a chemical vapour deposition (CVD) technique,
   wherein the dielectric layer has a thickness in a range 28-100 nm and an effective thermal boundary resistance ($TBR_{eff}$) at an interface between the layer of compound semiconductor material and the layer of polycrystalline CVD diamond material is 12-50 $m^2K/GW$, and
   wherein the seed layer has no voids having a thickness greater than 20 nm in a representative sample comprising an area of at least 200 nm×100 nm.

16. A method as recited in claim 15, wherein the dielectric layer comprises a ceramic material.

17. A method as recited in claim 15, wherein the layer of compound semiconductor material includes a GaN layer.

18. A method as recited in claim 16, wherein the layer of compound semiconductor material includes an AlGaN layer and the GaN layer is disposed on the AlGaN layer.

19. A method as recited in claim 16, wherein the seed layer has a volume fraction of voids of no more than 10%.

20. A method as recited in claim 15, wherein the step of forming a seed layer includes using a colloidal suspension of nano-crystalline diamond powder with deposition parameters controlled to achieve the effective thermal boundary resistance ($TBR_{eff}$).

* * * * *